United States Patent [19]

Usami

[11] Patent Number: 6,133,137

[45] Date of Patent: Oct. 17, 2000

[54] SEMICONDUCTOR DEVICE AND METHOD OF MANUFACTURING THE SAME

[75] Inventor: Tatsuya Usami, Tokyo, Japan

[73] Assignee: NEC Corporation, Tokyo, Japan

[21] Appl. No.: 09/144,069

[22] Filed: Aug. 31, 1998

[30] Foreign Application Priority Data

Sep. 2, 1997 [JP] Japan ................................ 9-237385

[51] Int. Cl.$^7$ ...................... H01L 21/4763; H01L 21/31
[52] U.S. Cl. .................... 438/622; 438/623; 438/637; 438/782; 438/711
[58] Field of Search ........................... 438/622, 623, 438/637–640, 672, 710–711, 725, 761, 780–782, 788–790, 668

[56] References Cited

U.S. PATENT DOCUMENTS 5,506,177  4/1996  Kishimoto et al. ...................... 438/782
5,883,014  3/1999  Chen et al. ............................ 438/782

FOREIGN PATENT DOCUMENTS

| 0 726 599 | 1/1995 | European Pat. Off. . |
| 5-47759 | 2/1993 | Japan . |
| 8-213383 | 8/1996 | Japan . |
| 8-236520 | 9/1996 | Japan . |
| 9-64037 | 3/1997 | Japan . |
| 10-214892 | 8/1998 | Japan . |
| 10-335458 | 12/1998 | Japan . |

OTHER PUBLICATIONS

Japanese Office Action, dated Mar. 1, 2000, with partial translation.
British Search Report dated Dec. 16, 1998.
T. Miyanaga, et al., "Proc. of the 43rd Symp., Applied Physics" (April 1996), p. 654, 26a–N–6.

Primary Examiner—Charles Bowers
Assistant Examiner—Thanh Nguyen
Attorney, Agent, or Firm—McGinn & Gibb, P.C.

[57] ABSTRACT

In a semiconductor device which includes at least an interlayer insulating film containing a plurality of Si—H bonds, a Si—OH bond portion is removed from a surface of the interlayer insulating film.

10 Claims, 3 Drawing Sheets

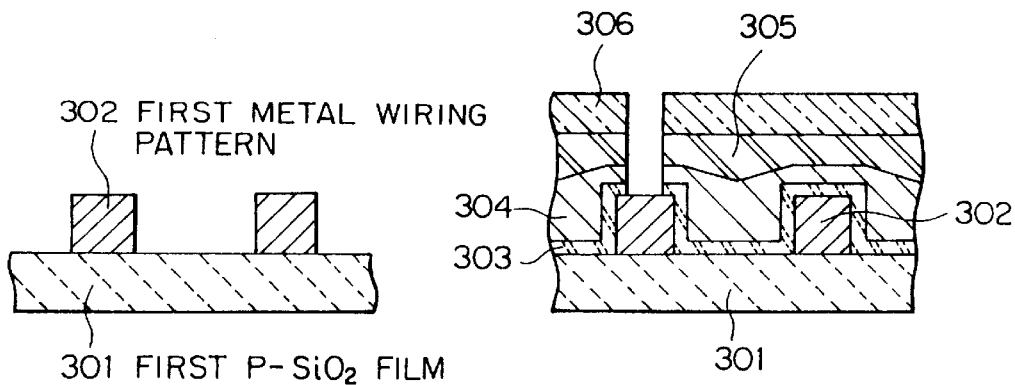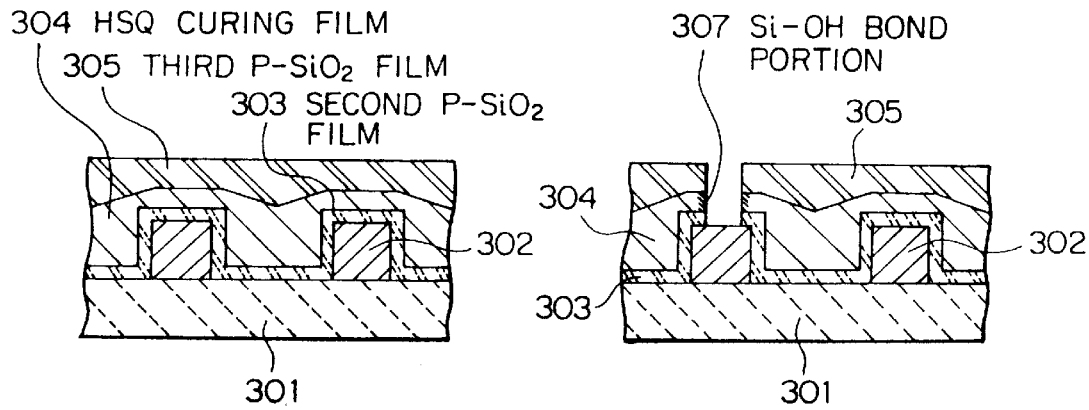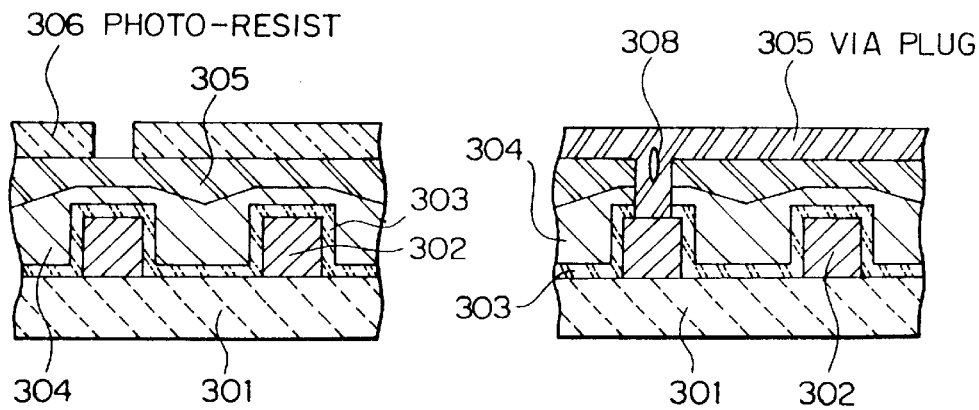

SEMICONDUCTOR DEVICE AND METHOD OF MANUFACTURING THE SAME

BACKGROUND OF THE INVENTION

This invention relates to a semiconductor device having an interlayer insulating film, such as, a SOG (Spin on Glass) film and a method of manufacturing the same.

Recently, a semiconductor integrated circuit has a trend in which a size thereof has been reduced. In particular, this trend is remarkable in a field of a multi-layer type wiring in a logic circuit.

As a distance between metal wiring patterns is reduced in the field of the above multi-layer type wiring, a cross talk often takes place between metal wiring patterns adjacent to each other. Herein, it is to be noted that the above-mentioned cross talk means that a wiring signal on one wiring pattern transfers to the adjacent wiring pattern.

In order to avoid the cross talk, it is effective to use an interlayer insulating film having a low dielectric constant. To this end, a variety of materials for the interlayer insulating film have been developed to apply them in the field of the above multi-layer type wiring.

Among the above materials, great attention has been paid for a hydrogen silsesquioxane (thereinafter, abbreviated as an HSQ) polymer as the interlayer insulating film, such as the SOG film. In this event, the HSQ film contains a plurality of Si—H bonds and has a porous structure.

When the semiconductor device is fabricated by using the HSQ as the interlayer insulating film, a through hole or a via hole is formed in the interlayer insulating film of the HSQ. In this case, the through hole is formed in the interlayer insulating film by the use of a photo-resist.

After the through hole is opened, the photo-resist is generally removed by an $O_2$ plasma process and a subsequent wet process.

As mentioned before, the HSQ insulating film has a plurality of Si—H bonds. These Si—H bonds are exposed to the above-mentioned $O_2$ plasma process at the surface of the HSQ insulating film in the through hole. In consequence, the Si—H bonds are reduced and changed into a Si—OH bond through the above-mentioned $O_2$ plasma process. This fact is disclosed in Proc. of the 43rd Symp., Applied Physics, p654, 26a-N-6 (April 1996).

As a result, the HSQ insulating film absorbs moisture in the subsequent wet process. Under this circumstance, when a via plug is formed in the through hole, a poisoned (e.g., contaminated) via is often formed in the via plug. This poisoned via makes the through resistance abnormal. In addition, the dielectric constant of the HSQ insulating film becomes unstable.

Thus, the conventional semiconductor device has a problem in which the HSQ insulating film absorbs moisture through the above-mentioned $O_2$ plasma process to cause the abnormality of the through resistance. This is because the Si—H bond at the surface of the HSQ insulating film in the through hole is changed into the Si—OH bond through the $O_2$ plasma process.

SUMMARY OF THE INVENTION

It is therefore an object of this invention to provide a semiconductor device and a method of manufacturing the same which is capable of effectively preventing an abnormality of a through hole resistance caused by a poisoned via in a via plug which is formed in an interlayer insulating film such as an HSQ insulating film.

It is another object of this invention to provide a semiconductor device and a method of manufacturing the same which is capable of making dielectric constant of the interlayer insulating film (the HSQ insulating film) stable.

According to this invention, a semiconductor device includes at least an interlayer insulating film. In this event, the interlayer insulating film contains a plurality of Si—H bonds.

On this condition, a via plug is placed in the interlayer insulating film. In this event, a Si—H bond portion is formed on a boundary between the interlayer insulating film and the via plug without a Si—OH bond portion.

Specifically, the via plug is placed in a through hole opened in the interlayer insulating film and has a predetermined through hole resistance.

Under this circumstance, the via plug is placed without a poisoned via in order to improve the through hole resistance.

In this event, the interlayer insulating film includes a SOG (Spin on Glass) film having a low dielectric constant. Herein, it is preferable that the SOG film is one selected from the group consisting of hydrogen silsesquioxane (HSQ) film, a methylsilsesquioxane film, an organic SOG film and a polysilazane film.

More specifically, the Si—H bond portion on the surface of the interlayer insulating film, such as, the HSQ insulating film is changed into the Si—OH bond portion through the $O_2$ plasma process. This Si—OH bond portion is again changed or returned to the Si—H bond portion via the subsequent hydrogen process. Consequently, no poisoned via takes place in the via plug formed in the via hole or the through hole. This is because the Si—H bond portion does not absorb the moisture different from the Si—OH bond portion. In consequence, no abnormality of the through hole resistance brings about, and the dielectric constant of the interlayer insulating film becomes stable in this invention.

In more detail, the interlayer insulating film, such as, the HSQ film has a plurality of Si—H bonds after a baking process. On this condition, when a surface portion of the inter insulating film is exposed to the $O_2$ plasma process, the surface portion is changed into the Si—OH bond. Thereafter, the surface portion is exposed to the hydrogen process ($H_2$ plasma process). Thereby, the following reaction is carried out.

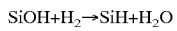

$$SiOH + H_2 \rightarrow SiH + H_2O$$

Through the above reaction, the Si—OH bond is eliminated because the remaining reacted material ($H_2O$) is vaporized. In consequence, the interlayer insulating film does not absorb the moisture in the subsequent wet process.

BRIEF DESCRIPTION OF THE DRAWINGS

FIGS. 1A through 1F are cross sectional views showing a method of manufacturing the conventional semiconductor device;

Figure 2:
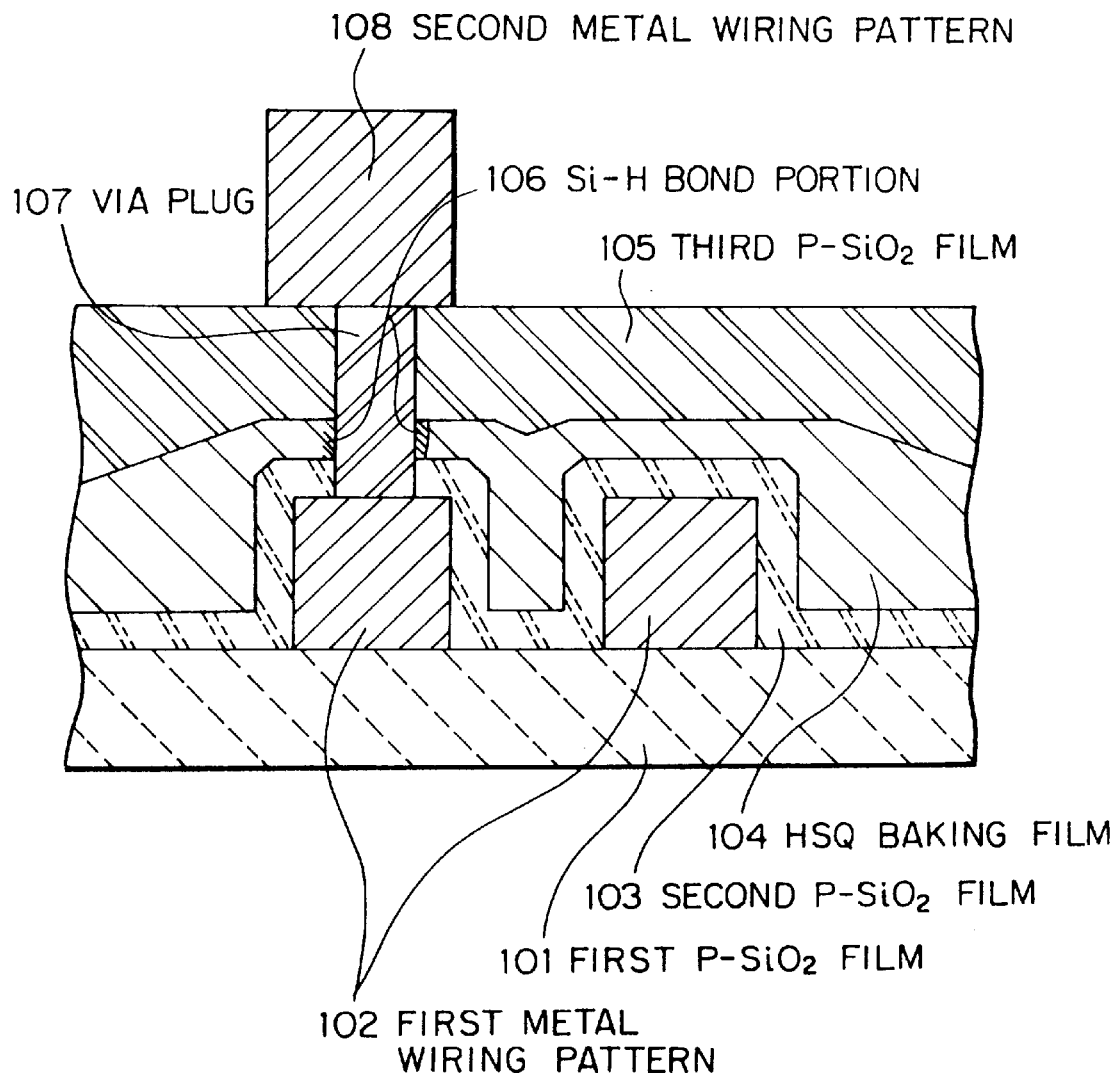
FIG. 2 is a cross sectional view showing a semiconductor device according to this invention.

DESCRIPTION OF THE PREFERRED EMBODIMENTS:

Referring to FIGS. 1A through 1F, a conventional method of manufacturing a semiconductor device will be first described for a better understanding of this invention. The semiconductor manufacturing method is equivalent to the conventional semiconductor manufacturing method mentioned in the preamble of the instant specification.

As illustrated in FIG. 1A, first metal wiring patterns 302 are formed on a first P—SiO$_2$ film 301.

Subsequently, a second P—SiO$_2$ film 303 is deposited on the first metal wiring patterns 302 to the thickness of 1000 Å so as to cover the first metal wiring patterns 302, as illustrated in FIG. 1B. Thereafter, the HSQ which is dissolved in a solvent is coated on the second P—SiO$_2$ film 303. After a baking process is sequentially carried out under three steps of 150° C., 200° C. and 350° C. at every one minute, a cure process is performed in an N2 atmosphere of 400° C. in a furnace. Consequently, an HSQ curing film 304 is deposited on the second P—SiO$_2$ film 303 to the thickness of about 4000 Å, as shown in FIG. 1B. In this event, the HSQ curing film 304 serves as an interlayer insulating film such as a SOG (Spin on Glass) film. As mentioned before, the HSQ curing film 304 contains a plurality of Si—H bonds and has a porous structure.

Next, a third P—SiO$_2$ film 305 is deposited on the HSQ curing film 304 to the thickness of 14000 Å, as shown in FIG. 1B. Subsequently, the known chemical mechanical polishing (thereinafter, referred to as CMP) process is carried out to flatten the surface, as illustrated in FIG. 1B.

Subsequently, a photo-resist 306 is coated and patterned to a predetermined shape, as illustrated in FIG. C.

Next, the HSQ curing film 304 and the second and third P—SiO$_2$ films 303 and 305 are opened or etched by the use of CF based gas to form the through hole or the via hole, as shown in FIG. 1D.

Thereafter, an O$_2$ plasma process is carried out to remove the photo-resist 306, as shown in FIG. 1E. In this case, the surface of the HSQ film 304 in the through hole is inevitably exposed to the O$_2$ plasma. In consequence, a Si—H bond portion of the HSQ curing film 304 are changed into a Si—OH bond portion 307 at the surface of the HSQ curing film 304, as illustrated in FIG. 1E. As a result, the HSQ curing film 304 absorbs moisture in the subsequent wet process for removing the photo-resist because the resultant HSQ curing film 304 contains the Si—OH bond portion 307.

Subsequently, a via plug 305 is formed in the through hole (or the via hole), as illustrated in FIG. 1F. In this case, when the via plug 305 is formed under the condition that the HSQ curing film 304 contains the Si—OH bond portion 307 illustrated in FIG. 1E, a poisoned via 308 is takes place in the via plug 305, as shown in FIG. 1F. This poisoned via 308 results in an abnormality of the through hole resistance.

Taking the above-mentioned problem into consideration, this invention provides a semiconductor device which is capable of effectively preventing the abnormality of the through hole resistance caused by the poisoned via in the via plug which is formed in the interlayer insulating film.

Subsequently, description will be made about a semiconductor device according to this invention with reference to FIG. 2.

As illustrated in FIG. 2, first metal wiring patterns 102 are placed on a first P—SiO$_2$ film 101. A second P—SiO$_2$ film 103 is deposited to the range between 500 Å and 1000 Å on the first metal wiring patterns 102. Further, the HSQ curing film 104 is coated thereon. Moreover, a third P—SiO$_2$ film 105 is placed on the HSQ curing film 104. Herein, the third P—SiO$_2$ film 105 is flattened by the use of the CMP process. In addition, a second metal wiring pattern 108 is placed on the third P—SiO$_2$ film 105. In this event, a via plug 107 is arranged in the second and third P—SiO$_2$ films 103 and 105 and the HSQ curing film 104 to electrically connect the first metal wiring pattern 102 with the second metal wiring pattern 108.

Under such a circumstance, the Si—H bond portion 106 is formed at the boundary between the via plug 107 and the HSQ curing film 104. In this example, the Si—OH bond portion (307) is not formed at the above boundary different from the case in FIG. 1E.

In this event, each of the first and second metal wiring patterns 102 and 108 is formed by Al or Cu, and may contain an impurity, such as, Cu, Si and Pd. Further, a barrier metal, such as, TiN, Ti and TiW may be formed over or below the first and second metal wiring pattern 102 and 108. Moreover, the via plug 107 is formed by W, Al and Cu, and the barrier metal, such as, TiN, Ti and TiW may be formed over or below the via plug 107 like the above case.

In this case, each of the second and third P—SiO$_2$ films 103 and 105 may be formed by either one of a SiH$_4$ based SiO$_2$, a TEOS based SiO$_2$, a trialkoxysilane based SiO$_2$ and a SiO$_2$ formed by the use of the known high density plasma CVD method.

Subsequently, description will be made about a first method of the semiconductor device according to this invention with reference to FIGS. 3A through 3F.

Figure 3A:
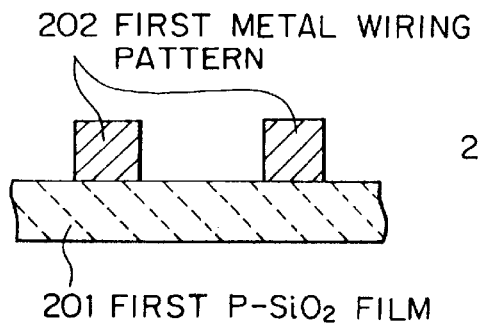
FIGS. 3A through 3F are cross sectional views showing a method of manufacturing a semiconductor device according to this invention.

As illustrated in FIG. 3A, first metal wiring patterns 202 are formed on a first P—SiO$_2$ film 201.

Figure 3D:
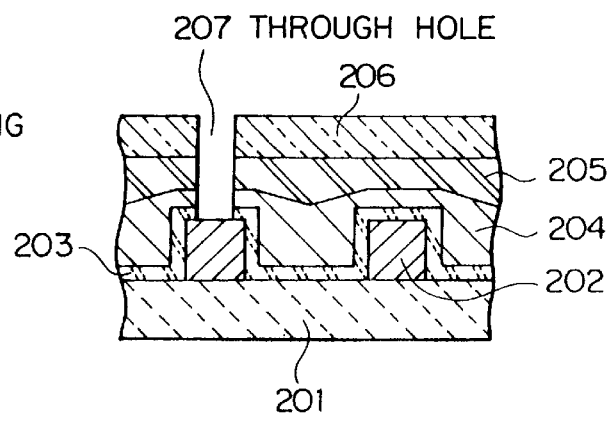
Figure 3B:
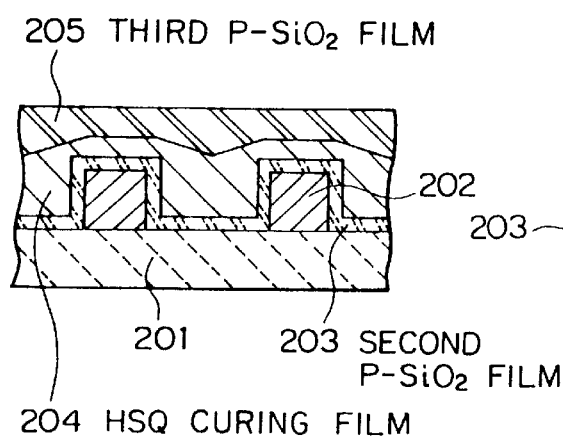

Subsequently, a second P—SiO$_2$ film 203 is deposited by the use of the known TEOS and O2 plasma CVD method so as to cover the first metal wiring patterns 202, as illustrated in FIG. 3B. Thereafter, the HSQ which is dissolved in a solvent (methylisobutylketone (MIBK)) is coated on the second P—SiO$_2$ film 203 under the rotation of about 3000-rpm. Next, a baking process is sequentially carried out under three steps of 150° C., 200° C. and 350° C in an N2 atmosphere. Thereafter, a cure process of 400° C. is performed in the N2 atmosphere by using the known vertical type furnace for about 60 minutes to form the HSQ curing film 204 to the thickness of 4000 Å, as shown in FIG. 3B. Herein, it is to be noted that the HSQ curing film 204 serves as an interlayer insulating film such as the SOG film. Further, the HSQ curing film 04 contains a plurality of Si—H bonds and has a porous structure, as mentioned above.

Next, a third P—SiO$_2$ film 205 is deposited to the thickness of about 14000 Å on the HSQ curing film 204 by the use of the known TEOS and O2 plasma CVD method, as shown in FIG. 3B.

Subsequently, the CMP process is carried out so that the film thickness on the first metal wiring pattern 210 is selected to about 8000 Å, as illustrated in FIG. 3B. In this event, one selected from the group of methylsilsesquioxane, an organic SOG and a polysilazane may be used instead of the HSQ.

Figure 3E:
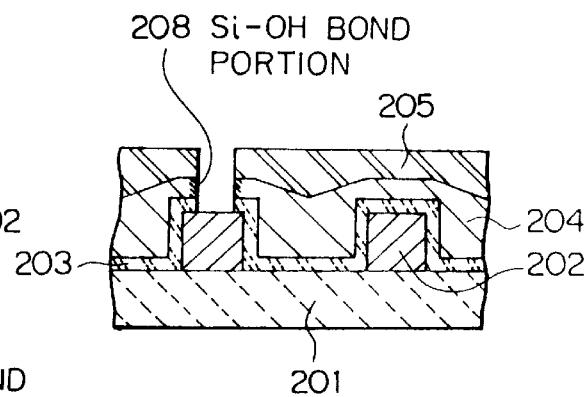
Figure 3C:
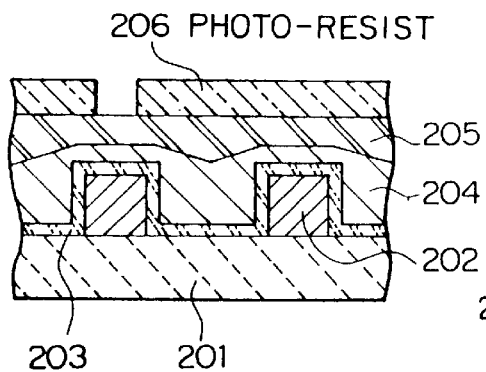

Next, a photo-resist 206 is coated on the HSQ curing film 205, as shown in FIG. 3C. Thereafter, exposure and development process is carried out for the photo-resist 206 to pattern it to a preselected shape, as illustrated in FIG. 3C.

Subsequently, the HSQ curing film 204 and the second and third P—SiO$_2$ films 203 and 205 are etched by using the photo-resist 206 as a mask, as shown in FIG. 3D. Consequently, a through hole 207 (or a via hole) is opened in the HSQ curing film 204 and the second and third P—SiO$_2$ films 203 and 205. Herein, it is to be noted that the HSQ curing film 204 has a Si—H bond portion on the surface thereof in the through hole 207.

Thereafter, O$_2$ plasma process and wet process are performed to remove the photo-resist 206, as shown in FIG. 3E. In this case, the surface of the HSQ curing film 204 is inevitably exposed to the O$_2$ plasma. In consequence, Si—H bond portion of the HSQ curing film 204 are changed into Si—OH bond portion 208 on the surface of the HSQ curing film 204 and in the through hole 207, as illustrated in FIG. 3E.

Figure 3F:
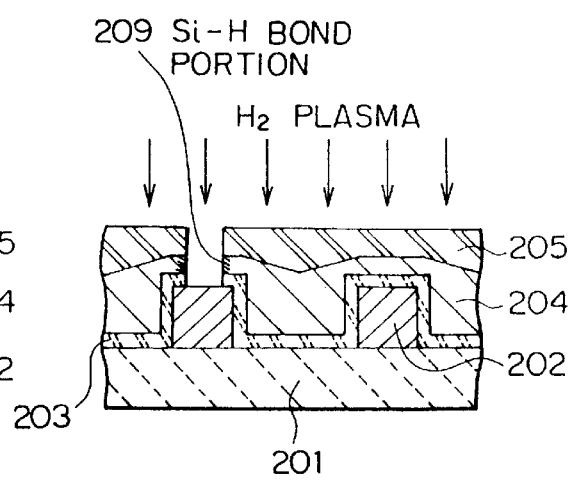

Subsequently, H$_2$ plasma process is carried out for the above surface, as illustrated in FIG. 3F. In this case, the H$_2$ plasma process is carried out for ten minutes by the use of the known ECR plasma which generates high-density plasma. Consequently, the Si—OH bond portion 208 illustrated in FIG. 3E is replaced by the Si—H bond portion 209, as shown in FIG. 3F. Namely, the Si—OH bond portion 208 in FIG. 3E is again changed to the Si—H bond portion 209.

Finally, the via plug (305) is formed in the through hole 207 in the same manner illustrated in FIG. 1F. In this case, the poisoned via (308) does not takes place in the via plug (305). This is because the final HSQ curing film 204 includes no Si—OH bond portion 208 different from the case illustrated in FIG. 1F. Consequently, the through hole resistance becomes normal in this example. Further, the dielectric constant of the HSQ curing film 304 becomes stable.

Subsequently, description will be made about a second method of manufacturing the semiconductor device with reference to FIGS. 3A through 3E.

In the second embodiment, the processes illustrated in FIGS. 3A through 3E are sequentially carried out in the same manner as the first embodiment.

However, the plasma process is performed by the use of PH$_3$ gas instead of the H$_2$ plasma process using hydrogen in the step illustrated in FIG. 3F in the second embodiment. In this event, P contained in the PH$_3$ serves as a catalyst for a reaction, and as a result, the reaction can be enhanced. Consequently, the Si—OH bond 208 (in FIG. 3E) can be effectively changed into the Si—H bond portion 209 (in FIG. 3F) as compared to the case of the hydrogen.

Further, one selected from the group of B$_2$H$_6$ gas, CH$_4$ gas, and C$_2$H$_6$ gas may be used as the other gas during the above plasma process. In this event, the same effect as the first embodiment can also be obtained.

What is claimed is:

1. A method of manufacturing a semiconductor device, comprising:

forming an interlayer insulating film containing a plurality of Si—H bonds over an insulating film; and opening a through hole in said interlayer insulating film with a Si—OH bond portion which is left on a surface of the interlayer insulating film and which results from the Si—H bonds; and breaking the Si—OH bond portion from the surface using a plasma process from the group consisting of PH$_3$gas, B$_2$H$_6$ gas, CH$_4$ gas and C$_2$H$_6$ gas so that the Si—OH bond portion is changed into a Si—H bond portion.

2. A method as claimed in claim 1, further comprising:

forming a via plug in the through hole, said via plug having a through hole resistance, said via plug being formed in said interlayer insulating film without a poisoned via in order to improve the through hole resistance.

3. A method as claimed in claim 1, wherein;

said interlayer insulating film comprises a SOG (Spin on Glass) film having a low dielectric constant.

4. A method as claimed in claim 3, wherein:

said SOG film is one selected from the group consisting of hydrogen silsesquioxane (HSQ) film, a methylsilsesquioxane film, an organic SOG film and a polysilazane film.

5. A method of manufacturing a semiconductor device, comprising the steps of:

forming a first wiring pattern on a first insulating film;

depositing a second insulating film on said wiring pattern so as to cover said first wiring pattern;

coating an interlayer insulating film on said first insulating film;

depositing a third insulating film on said interlayer insulating film;

coating a photo-resist on said third insulating film;

patterning said photo-resist to a shape;

etching said second and third insulating films and said interlayer insulating film by using said patterned photo-resist as a mask to form a through hole;

removing said photo-resist by the use of a first plasma process containing oxygen such that a Si—OH bond portion is formed on a surface of said interlayer insulating film in the through hole; and performing a second plasma process using a plasma process from the group consisting of PH$_3$ gas, B$_2$H$_6$ gas, CH$_4$ gas, and C$_2$H$_6$ gas on the surface so that the Si—OH bond portion is changed into a Si—H bond portion.

6. A method as claimed in claim 5, further comprising the step of:

performing a wet process after said first plasma process to remove said photo-resist.

7. A method as claimed in claim 14, further comprising:

forming a via plug in the through hole, said via plug having a through hole resistance, said via plug being formed in said interlayer insulating film without a poisoned via in order to improve the through hole resistance.

8. A method as claimed in claim 5, wherein;

said interlayer insulating film comprises a SOG (Spin on Glass) film having a low dielectric constant.

9. A method as claimed in claim 8, wherein:

said SOG film is one selected from the group consisting of hydrogen silsesquioxane (HSQ) film, a methylsilsesquioxane film, an organic SOG film and a polysilazane film.

10. A method as claimed in claim 14, wherein:

each of said first, second and third insulating film comprises a SiO$_2$ film.

* * * * *